United States Patent
Price

(10) Patent No.: US 7,580,138 B2
(45) Date of Patent: Aug. 25, 2009

(54) METHODS AND SYSTEMS FOR CHARACTERIZING SEMICONDUCTOR MATERIALS

(75) Inventor: James Martin Price, Austin, TX (US)

(73) Assignee: Sematech, Inc., Austin, TX (US)

( * ) Notice: Subject to any disclaimer, the term of this patent is extended or adjusted under 35 U.S.C. 154(b) by 744 days.

(21) Appl. No.: 11/179,357

(22) Filed: Jul. 12, 2005

(65) Prior Publication Data

US 2007/0015295 A1   Jan. 18, 2007

(51) Int. Cl.
G01B 11/28 (2006.01)
(52) U.S. Cl. .......... 356/630; 356/300; 702/189
(58) Field of Classification Search ........... 356/630; 348/14, 16; 702/189
See application file for complete search history.

(56) References Cited

U.S. PATENT DOCUMENTS

| | | | | |
|---|---|---|---|---|
| 5,796,983 | A | 8/1998 | Herzinger et al. | 703/2 |
| 5,864,633 | A | 1/1999 | Opsal et al. | 382/141 |
| 5,907,401 | A | 5/1999 | Clarke et al. | 356/451 |
| 5,963,329 | A | 10/1999 | Conrad et al. | 356/613 |
| 6,326,619 | B1 * | 12/2001 | Michael et al. | 250/310 |
| 6,465,265 | B2 | 10/2002 | Opsal et al. | 438/16 |
| 6,785,638 | B2 | 8/2004 | Niu et al. | 702/189 |
| 6,934,900 | B1 | 8/2005 | Cheng et al. | 714/738 |
| 7,209,535 | B2 * | 4/2007 | Chen et al. | 378/4 |
| 2002/0045282 | A1 | 4/2002 | Opsal et al. | 438/16 |
| 2004/0220760 | A1 | 11/2004 | Niu et al. | 702/76 |
| 2004/0257566 | A1 | 12/2004 | Chism | 356/369 |

FOREIGN PATENT DOCUMENTS

| | | |
|---|---|---|
| EP | 0710848 | 5/1996 |
| WO | WO 98/28606 | 7/1998 |
| WO | WO 99/02970 | 1/1999 |
| WO | WO 2004/107026 | 12/2004 |

OTHER PUBLICATIONS

Aspnes, "The analysis of opitical spectra by fourier methods," *Surface Science*, 135:284-306, 1983.
Edwards et al., "Optical characterization of wide bandgap semiconductors," *Thin Solid Films*, 364:98-106, 2000.
PCT International Search Report, dated Oct. 18, 2006.
Yoo and Aspnes, "Elimination of endpoint-discontinuity artifacts in the analysis of spectra in reciprocal space," *J. Appl. Phys.*, 89:8183-8192, 2001.
Yoo et al., "Analysis of optical spectra by Fourier methods," *Thin Solid Films*, 313-314:143-148, 1998.

(Continued)

*Primary Examiner*—Kara E Geisel
(74) *Attorney, Agent, or Firm*—Fulbright & Jaworski LLP

(57) ABSTRACT

Methods for determining parameters of a semiconductor material, in particular non-classical substrates such as silicon-on-insulator (SOI) substrates, strained silicon-on-insulator (sSOI) substrates, silicon-germanium-on-insulator (GOI) substrates, and strained silicon-germanium-on-insulator (sGeOI) substrates. The method provides steps for transforming data corresponding to the semiconductor material from real space to reciprocal space. The critical points are isolated in the reciprocal state and corresponding critical energies of the critical points are determined. The difference between the critical energies may be used to determine a thickness of a layer of the semiconductor material, in particular, a quantum confined layer.

20 Claims, 4 Drawing Sheets

OTHER PUBLICATIONS

Yoo et al., "High-resolution spectroscopy with reciprocal-space analysis: application to isotopically pure Si," *Physica Status Solidi B*, 220:117-125, 2000.

Sanders and Chang, "Theory of optical properties of quantum wires in porous silicon," *Phys. Rev. B.*, 45:9202, 1992.

Zhao et al., "Quantum Confinement and Electronic Properties of Silicon Nanowires," *Phys. Rev. Lett.*, 92:236805, 2004.

Karrer et al., "Optical Properties of Cl-Doped ZnSe Epilayers Grown on GaAs Substrates," *J. Elect. Mat.*, 34:944-948, 2005.

PCT Invitation to Pay Additional Fees, dated Feb. 21, 2007.

Gavrilenko et al., "Electroreflectance spectra of thin silicon films," *Thin Solid Films*, 37:201-206, 1976.

PCT International Search Report and Written Opinion, issued in International Application No. PCT/US2006/040262, dated May 10, 2007.

\* cited by examiner

METHODS AND SYSTEMS FOR CHARACTERIZING SEMICONDUCTOR MATERIALS

BACKGROUND OF THE INVENTION

1. Field of the Invention

The present invention relates generally to optical techniques for characterizing semiconductor materials. More particularly, the present invention involves methods for determining parameters in non-classical semiconductor materials including, without limitation, silicon-on-insulator (SOI) substrates, strained silicon-on-insulator (sSOI) substrates, silicon-germanium-on-insulator (GOI) substrates, and strained silicon-germanium-on-insulator (sGeOI) substrates.

2. Description of Related Art

Current integrated circuit (IC) manufacturing processes employ bulk silicon substrates for the fabrication of semiconductor devices. During the manufacturing process, in-line metrology techniques such as spectroscopic ellipsometry (SE) and reflectometry can be used to determine the properties of the substrate. Using these techniques and certain characteristics of the silicon substrate, e.g., the optical properties of the substrate, parameters such as thickness and refractive index of the layers deposited on the silicon substrate can be determined. In most cases, the optical constants are parameterized in some form of an oscillator model.

With the introduction of non-classical substrates, including silicon-on-insulator (SOI) substrates, strained silicon-on-insulator (sSOI) substrates, silicon-germanium-on-insulator (GOI) substrates, and strained silicon-germanium-on-insulator (sGeOI) substrates and the like, traditional in-line metrology techniques are inadequate to accurately characterize the properties of these substrates. For example, SOI substrates that are less than 10 nanometers in thickness can include additional quantum mechanical properties than can affect the optical and electrical properties of the substrates. However, current SE techniques use classical oscillator based optical models and therefore may not account for these quantum mechanical corrections to the properties in the substrates. Thus, using current SE techniques to characterize SOI substrates will affect the accuracy of the measurement. Additionally, due to the multiple layers common in non-classical substrates, current techniques that simultaneously measure multiple parameters and may generate erroneous results due to correlation factors.

Any shortcoming mentioned above is not intended to be exhaustive, but rather is among many that tends to impair the effectiveness of previously known techniques for characterizing substrates; however, shortcomings mentioned here are sufficient to demonstrate that the methodologies appearing in the art have not been satisfactory and that a significant need exists for the techniques described and claimed in this disclosure.

SUMMARY OF THE INVENTION

The present disclosure provides techniques for characterizing non-classical substrates. Particularly, methods are provided for considering corrections to optical properties due to quantum mechanical effects associated with non-classical substrates in which parameters such as, but not limited to, band gap and/or thickness of the semiconductor materials can be determined.

In one respect, data that contains contributions from two different critical points, one bulk 3D silicon and one from a 2D confined silicon layer may be analyzed for SOI substrates. Alternatively, for substrates such as, but not limited to, sSOI or sGeOI, a 3D critical point and a critical point due to a strained silicon layer may be analyzed. However, when viewed in real space (i.e., as a function of photon, energy or wavelength), the two individual critical points are not readily apparent. As such, in one embodiment, this data may be mapped into reciprocal space (i.e., as a function of Fourier coefficient index, n), such that the information from the critical points is separated from that of the baseline effects due to internal reflections and noise. Once the critical point parameters are realized in reciprocal space, they then can be re-cast in real space independent of baseline information and film interference effects that initially convolute the signal as governed by the Fresnel equations. Identification of the separate inversion origins of each critical point (band gap) may then be used to calculate the thickness of the quantum confined layer. In one embodiment, the techniques used do not require curve fitting or linear regression techniques. As such, errors due to correlation, curve fitting, and the like of conventional in-line optical techniques may be reduced or substantially eliminated.

In other respects, a method is provided. A semiconductor material, such as, but not limited to, bulk silicon, silicon-on-insulator (SOI) substrates, strained silicon-on-insulator (sSOI) substrates, silicon-germanium-on-insulator (GOI) substrates, and strained silicon-germanium-on-insulator (sGeOI) substrates may be provided. In some embodiments, the semiconductor material may include a plurality of layers.

Next, data corresponding to the semiconductor material may be obtained. For example, techniques including, without limitations, spectroscopic ellipsometry, reflectometry, modulation spectroscopy, photo-luminescence, second harmonic generation (SHG), spectroscopic ellipsometry, reflectometry, modulation spectroscopy, photo-luminescence, second harmonic generation (SHG), or any combination thereof may be used.

The data, which may be raw data, can be transformed into reciprocal space data. Next, a critical point parameter from the reciprocal space data may be determined. The reciprocal space data may be converted into real space data and the characterizing of at least one of the plurality of layers of the semiconductor material may be done. For example, in some embodiments, the thickness of one of the layers of the semiconductor material such as a silicon on insulator substrate may be determined.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The figures are examples only. They do not limit the scope of the invention.

DESCRIPTION OF ILLUSTRATIVE EMBODIMENTS

Figure 1A:
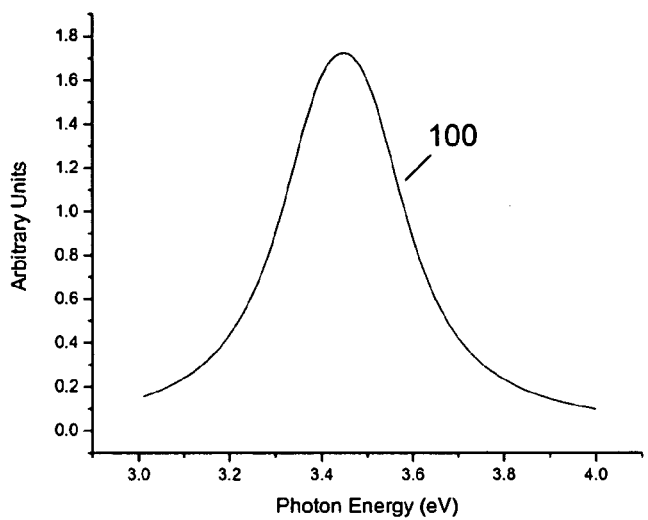
FIGS. 1A-1C are graphs illustrating data being transformed, in accordance with embodiments of this disclosure.

The disclosure and the various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The disclosure provides for characterizing quantum mechanical properties seen in semiconductor materials, particularly thin substrates (having about or less than approximately 10 nanometers). For example, the band edge energy shift can affect the electrical and optical response of a silicon layer in substrates such as, but not limited to, silicon-on-insulator (SOI) substrates, strained silicon-on-insulator (sSOI) substrates, silicon-germanium-on-insulator (GOI) substrates, and strained silicon-germanium-on-insulator (sGeOI) substrates. Generally, a quantum confined layer may be a thin film regime, where the thickness is less than approximately 10 nanometers, the top layer may be a silicon layer. The quantum confined layer may be realized as a quantum well with a barrier width substantially equal to the silicon thickness, an electron potential trap due to the buried oxide layer band gap of approximately 9.0 electron Volts (eV), and an infinite potential barrier due to air. Quantum mechanics dictate that for such a model, the electron has quantized energy eigenstates as follows:

$$\Delta E = \frac{(\pi \hbar)^2}{2m^* L^2} \qquad \text{Eq. 1}$$

where E is the photon energy, L is the thickness of the semiconductor material, m is an effective mass of a confined electron, and $\hbar$ is Planck's constant. As seen from Eq. 1, the quantization effects increase with decreasing silicon thickness.

In addition to the discrete energy state, the corresponding electron joint density-of-states (JDOS) has an energy dependent function form change. The JDOS for a 3D (bulk) electron, $\rho(E)$, with excitation energies centered at a critical point $E_g$ is as follows:

$$\rho(E) \propto (E - E_g)^{\frac{1}{2}} \qquad \text{Eq. 2}$$

For a 2D confined electron, the DOS is:

$$\rho(E) \propto \Theta(E-E_g) \qquad \text{Eq. 3}$$

where $\Theta$ is the Heaviside step function. The JDOS is proportional to the imaginary part of the dielectric function, and therefore, shows that quantum confinement effects also change the shape of absorption around critical point energies. With a decrease in the dimensionality of the semiconductor material, the absorption centered at a critical point changes from a parabolic shape to a piece-wise step function In one embodiment, the critical point parameters of the quantum confined layer may be determined. This step may be performed without knowing the chemical composition or thickness of other films, such as, but not limited to, native oxide, barrier layer, and the like, present. Using the critical point parameters, specifically the energy difference between the critical points, the thickness of the non-classical substrates may be determined.

Determining Critical Point Parameters

Figure 1B:
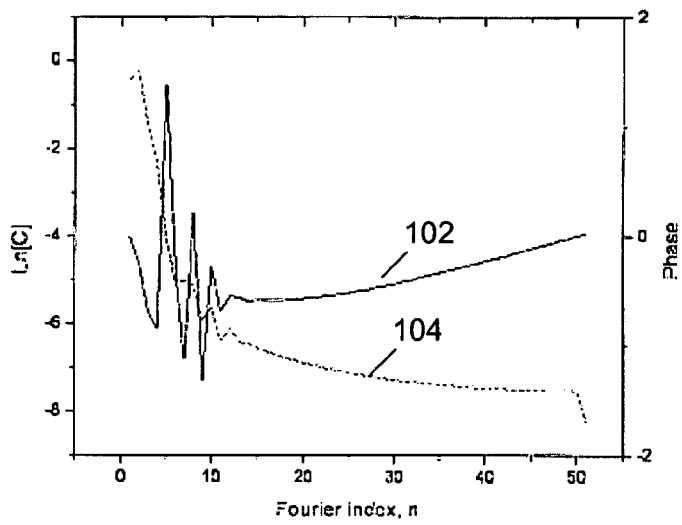

In one embodiment, a reciprocal space analysis may be used to characterize the quantum confined layers. First raw data in real space, obtained from conventional means including, but not limited to, spectroscopic ellipsometry, reflectometry, modulation spectroscopy (e.g., electro-reflectance or photo-reflectance), photo-luminescence, second harmonic generation (SHG), and the like, may be transformed into reciprocal space data, as seen in FIGS. 1A to 1B. FIG. 1A includes raw data 101. In some embodiments, raw data 101 may include a 2D critical point and a 3D critical point. In other embodiments, raw data 101 may include a critical point contributed from a strained silicon layer and a 3D critical point. Alternatively, raw data 101 may include only a 3D critical point. FIG. 1B illustrates the conversion of raw data 101 in FIG. 1A to reciprocal space data. Line 102 is the phase of the Fourier coefficient versus the Fourier index, n, and line 104 is the amplitude of the Fourier coefficient versus the Fourier index. Details of the phase and amplitude will be described in more details below.

The transformation from real space data to reciprocal space data, using Fourier methods, may truncate optical spectral data around a critical point absorption feature. For example, a set of raw data, which can be represented as a Lorentzian line shape or a Gaussian line shape, may be described as follows:

$$L(E) = \frac{C\Gamma}{(E - E_g + i\Gamma)^\mu} \qquad \text{Eq. 5}$$

Here, C, $\Gamma$, $E_g$, and $\mu$ are the amplitude, broadening, inversion origin (i.e., band gap for the direct gap semiconductor absorption peaks), and order, respectively.

The corresponding amplitude and phase, $C_n$ and $\xi_n$ of the Fourier coefficient's are (as a function of the transform index, n):

$$C_n = \frac{Cn^{\mu-1}}{\Delta E^\mu \Gamma(\mu)} e^{\frac{-n\Gamma}{\Delta E}} \qquad \text{Eq. 6}$$

$$\xi_n = -(\mu - \kappa)\frac{\pi}{2} + \frac{n(E_g - E_0)}{\Delta E}. \qquad \text{Eq. 7}$$

Here, $\Delta E$ is a scaling factor that may ensure periodicity within the truncated data set necessary for a Fourier transform, $\Gamma(\mu)$ is a gamma function, $\kappa$ is the integer order of differentiation, and $E_0$ is the inversion origin energy offset.

From the series representation of the Fourier amplitudes $C_n$, the order $\mu$ (which may be related to the dimensional dependence), broadening $\Gamma$, and the amplitude C of the critical points can be obtained. The line shape, which may be derived from the order $\mu$, of the critical points may be determined by the amplitude of the Fourier coefficients (Eq. 6) and $E_g$ may be determined by the phase (Eq. 7) of the Fourier coefficients. The above differentiation shows that the band gap may be phase coherent independent of the line shape or differentiation (minus a constant offset). The technique transforms the data from real-space into reciprocal space, where the critical point features are more pronounced and may be distinct from noise and baseline effects. In addition, the above equations may be able to extract multiple critical point features directly and independent of curve fitting or regression analysis typically found in current optical techniques.

Figure 1C:
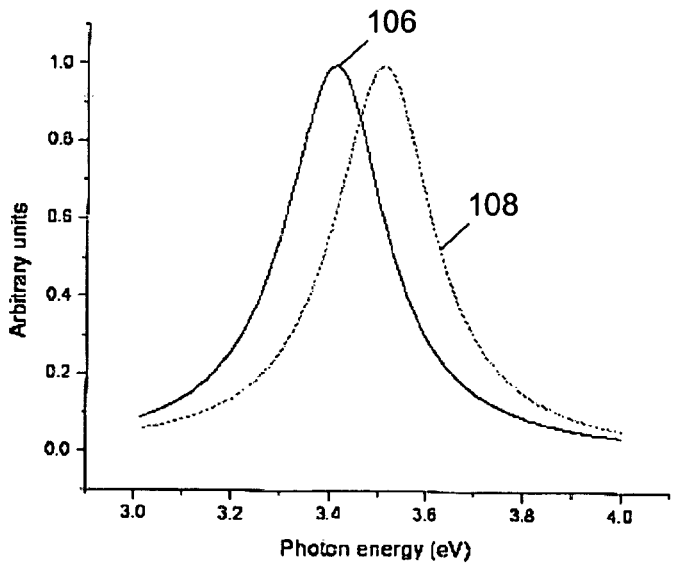
Figure 2:
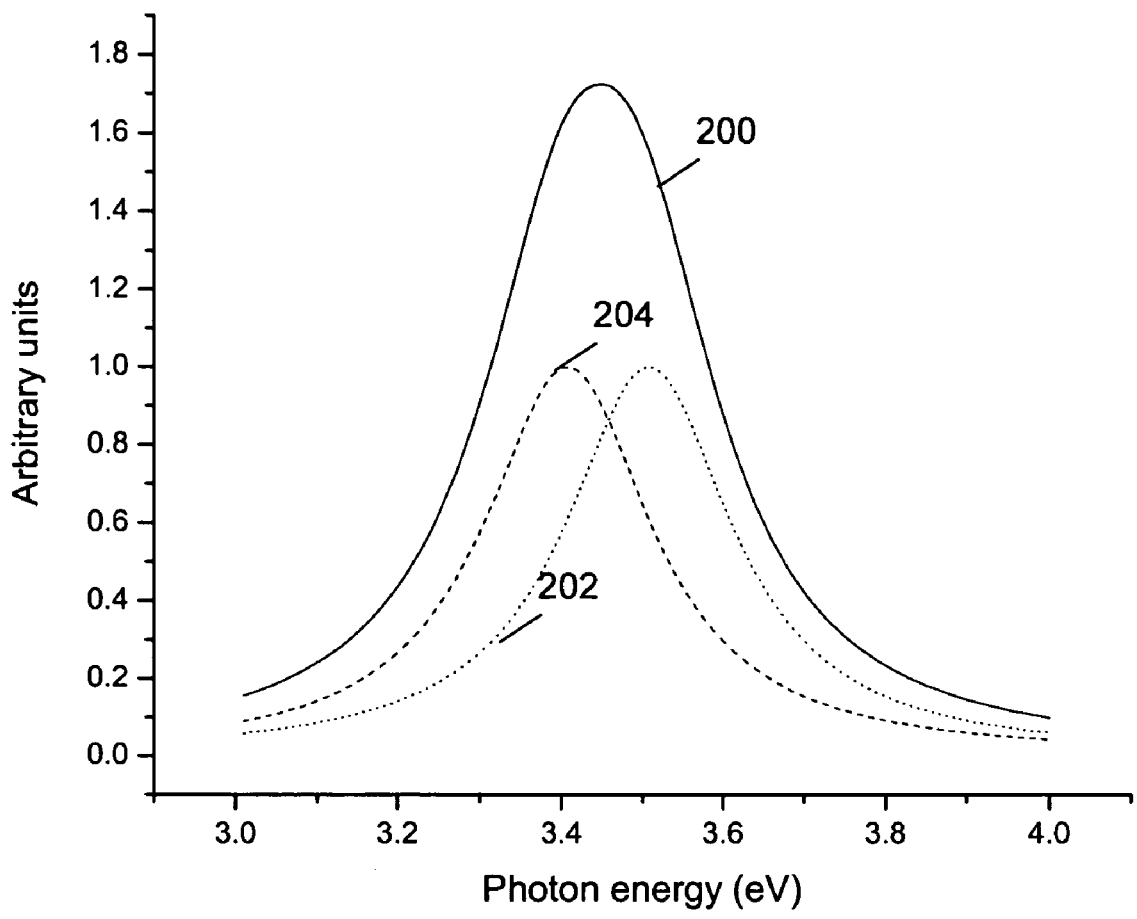
FIG. 2 are graphs of a 2D, 3D isolated critical points and a convoluted graph, in accordance with embodiments of this disclosure.

For non-classical substrates, there may be a bulk 3D critical point from the underlying substrate, and a quantum 2D critical point from a top layer of the quantum confined layer within a short energy range. These two critical points (3D and 2D critical points) may be embodied in the raw data, i.e., a spectral curve as defined by the Fresnel Reflection coefficients with spectroscopic ellipsometry or reflectometry, as seen in FIG. 2. In one embodiment, raw data 200 may include 3D critical point 204 and 2D critical point 202. In other words, if 3D critical point 204 and 2D critical point 202 were convoluted, raw data 200 may result. Current in-line metrology may not be able to extract the information from raw data 200. To isolate these critical points, the data in the reciprocal space (FIG. 1B) may be converted back into real space, where the critical points may be isolated (FIG. 1C). In one embodiment, the 3D critical point 106 and the 2D critical point 108 are isolated.

Determining Quantum Confined Layers

When more than one critical point is present within the reciprocal data, interference fringes may be observed. The presence of interference fringes may be indicative of a quantum confined layer. For example, if interference fringes are observed when spectral data are mapped into reciprocal space by Fourier methods, the top silicon layer may be quantum confined and the optical properties may behave different than conventional bulk silicon. If the reciprocal data does not include interference fringes, the optical properties may be similar to a conventional bulk substrate.

In one embodiment, there may be an onset in absorption due to electron transitions between the absolute valence band maximum and the conduction band minimum. This is known as the fundamental absorption band edge. Silicon has a direct absorption band edge at approximately 3.38 eV and corresponds to a direct transition (i.e., electronic transition between the valence band and conduction band with occurring at the same wave vector, k). This transition produces a singularity in the Joint-Density-of-States (JDOS), also known as a critical point. For a 3D "bulk" critical point, the energy function form is that of Eq. 2, whereas for a 2D critical point, the energy function form is that of Eq. 3. Identification of these line shapes corresponding to the critical points provides information on the electronic and optical properties of the material.

For example, for a SOI substrate with a thickness that is greater than about 10 nanometers, the critical point at the silicon band edge may respond in the same fashion as a conventional, bulk substrate, where the 3D critical point is represented by Eq. 2. When spectral curves are produced, similar to those of FIG. 1, the absorption characteristics may coincide and no interference fringes may be observed. In the case where the top silicon layer is thin enough to create a quantum well, the silicon band edge may resemble a 2D critical point, and may be represented by Eq. 3. These two different critical points may be separated by a finite energy difference and may provide two different contributions. As such, when the two critical points are mapped into reciprocal space by Fourier methods, interference fringes may result. For strained silicon applications (i.e., sSOI and sGeOI), the critical point at the silicon band edge may be different than the bulk silicon critical point at the band edge.

Phase Renormalization for Modulation Spectroscopy Techniques

As described above, the critical points may be determined when data obtained from a semiconductor material using conventional methods may be transformed into reciprocal space and the corresponding Fourier coefficients are analyzed. Parameters such as band gap or inversion origin, dimensionality, broadening, and thickness may be extracted from the analysis. In some embodiments, the conventional methods used to obtain the data from the semiconductor material may introduce baseline effects from phase shifts due to film interference. As such, in one embodiment, the data may be normalized in order to factor out the different contributions to varying thicknesses.

In one embodiment, when multiple interfaces are present, for example, in SOI substrates, interference induced phase shifts may be present that shifts the inversion origin of the raw data, as seen in FIG. 2. The inversion point, or center point, of 3D critical point differs from 2D critical point. As such, the raw data may be normalized such that any interference contributions may be removed and the raw data's inversion origin is centered about the critical point inversion origin (i.e., band gap).

In one embodiment, a modulus approach may be used to normalize the data. A spectral signal, $\Phi$, may be represented as a real part of a complex signal $\phi$, where $\Phi$ is as follows:

$$\Phi = Re[\hat{\phi}] = Re[Me^{i\theta}] \qquad \text{Eq. 8}$$

In Eq. 8, M is the modulus and $\theta$ is the phase angle and both vary with photon energy. It is noted that thickness variations of a semiconductor material manifest itself in the phase angle for modulation spectroscopy techniques, and as such, to center the inversion origin irrespective of contributing thickness, Eq. 8 is solved to remove the phase angle. For example, since spectral responses generally obey causality, the imaginary part of the signal may be obtained from the real part using Kramers-Kronig transformation. As such, the modulus becomes:

$$M = \sqrt{\Phi^2 + [Im[\hat{\phi}]]^2} \qquad \text{Eq. 9.}$$

Since the interference effects may be due to multiple interferences manifested in the phase shift signal, $\theta$, the modulus M may normalize the spectral response and center the critical point contributions about the proper inversion origin, but with different amplitudes.

Figure 3:
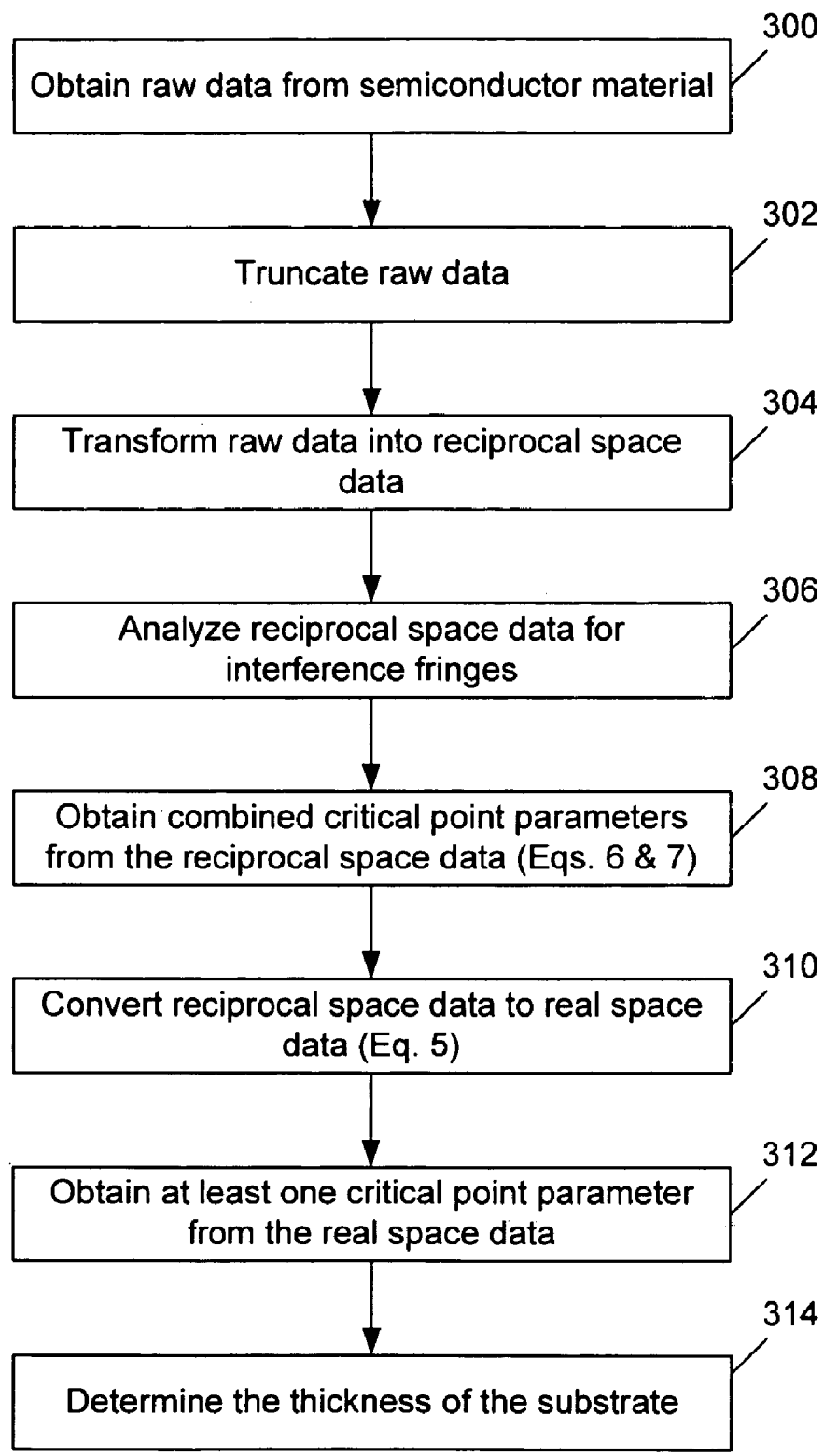
FIG. 3 is a flowchart of a method for determining critical points, in accordance with embodiments of this disclosure.

Referring to the flowchart of FIG. 3, in one embodiment, raw data corresponding to a semiconductor material may be obtained using techniques such as, but not limited to, any form of spectroscopic ellipsometry, reflectometry, modulation spectroscopy (e.g., electro-reflectance or photo-reflectance), photo-luminescence, second harmonic generation (SHG), and/or any combination of the above (step 300). The data may represent any quantum confined semiconductor structure. Alternatively, the data may represent any non-classical substrate, including non-classical substrates that include a shifting in critical points due to quantum confinement and/or strain (sSOI or sGeOI). In one embodiment, the data may include at least two critical point parameters. In order to extract the critical point parameters, the data may be transformed in reciprocal space where the critical point parameters may be isolated.

Figure 4:
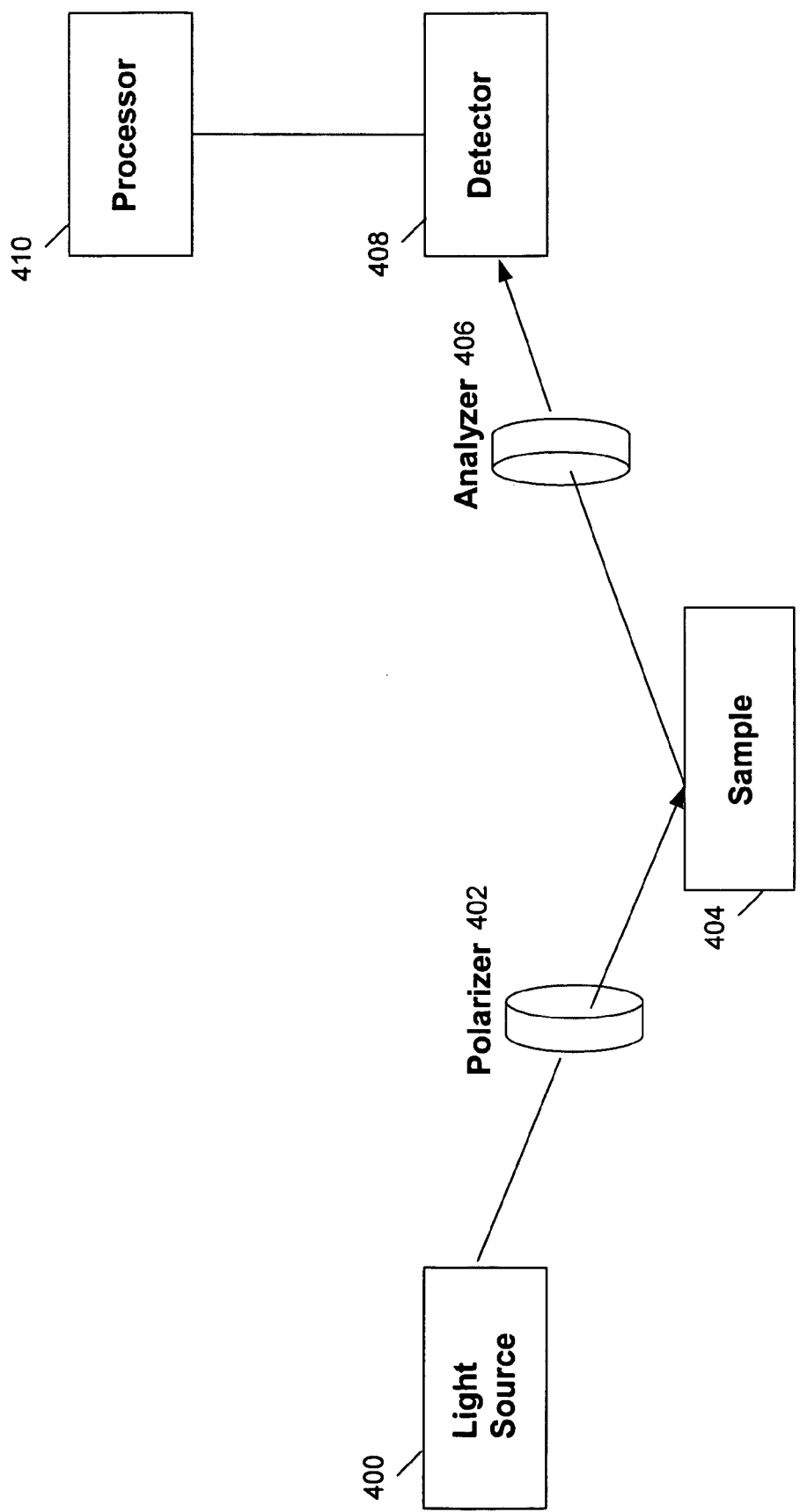
FIG. 4 is a system, in accordance with embodiments of this disclosure.

In one embodiment, the data may be collected using the system shown in FIG. 4. Light source 400, including, without limitation, lasers, ultraviolet (UV), visible light source and the like, and which may be positioned at an angle of incidence, may include multi-wavelengths (spectroscopic) and may be used to illuminate sample 404. Sample 404 may be a substrate including, without limitation, bulk silicon substrate, silicon-on-insulator (SOI) substrates, strained silicon-on-insulator (sSOI) substrates, silicon-germanium-on-insulator (GOI) substrates, and strained silicon-germanium-on-insulator (sGeOI) substrates.

In one embodiment, the beam of light from light source 400 may be optionally polarized using techniques known in the art. For example, polarizing lens 402 may be provided and an incident polarized photon beam may be provided to sample 404. Alternatively, the light beam from light source 400 may be applied directly to sample 404.

The light beam from light source 400 may be reflected from sample 404 and may be directed towards analyzer 406. In one embodiment, analyzer element 406 may be used for polarization based techniques know in the art. Alternatively, the beam reflected off of sample 404 may be directly provided to detector 408. Detector 408 may generate data corresponding to techniques, such as, but not limited to, spectroscopic ellipsometry, reflectometry, modulation spectroscopy (e.g., electro-reflectance or photo-reflectance), photo-luminescence, second harmonic generation (SHG), and/or any combination of the above. The data may be sent processor 410. Processor 410 may be any computer-readable media known in the art. For example, it may be embodied internally or externally on a hard drive, ASIC, CD drive, DVD drive, tape drive, floppy drive, network drive, flash, or the like. Processor 410 is meant to indicate any computing device capable of executing instructions for receiving the data from the detector and amongst other functions, may implement the steps shown in FIG. 3. In one embodiment, processor 410 is a personal computer (e.g., a typical desktop or laptop computer operated by a user). In another embodiment, processor may be a personal digital assistant (PDA) or other handheld computing device.

In some embodiments, processor 410 may be a networked device and may constitute a terminal device running software from a remote server, wired or wirelessly. Input from a user, detector 408, or other system components, may be gathered through one or more known techniques such as a keyboard and/or mouse. Output, if necessary, may be achieved through one or more known techniques such as an output file, printer, facsimile, e-mail, web-posting, or the like. Storage may be achieved internally and/or externally and may include, for example, a hard drive, CD drive, DVD drive, tape drive, floppy drive, network drive, flash, or the like. Processor 410 may use any type of monitor or screen known in the art, for displaying information, such as but not limited to, figures similar to FIGS. 1A, 1B, 1C, and 2.

For example, a cathode ray tube (CRT) or liquid crystal display (LCD) can be used. One or more display panels may also constitute a display. In other embodiments, a traditional display may not be required, and processor 410 may operate through appropriate voice and/or key commands.

In some embodiments, prior to converting the raw data into reciprocal space data and finding the critical points, if raw data was collected using a modulation technique, such as, but not limited to modulation spectroscopy (e.g., electro-reflectance or photo-reflectance), a normalization process may be needed. In one embodiment, using Eq. 8 and Eq. 9, a modulus may be determined (not shown).

After the raw data has been obtained, the data may be conformed to a periodic function. In one embodiment, the number of data points may be an even integer, and the difference between each data point may be a constant. Additionally, the number of data points needs to be sufficient to resolve the individual peaks upon transformation.

In some embodiments, the raw data may be truncated (step 302). For example, a portion of the raw data may be centered about the silicon direct band edge at approximately 3.38 eV. The raw data may be truncated to include this portion such that the contribution from the silicon direct band edge critical point can be observed. For a lower bound energy cut-off, it may be necessary to extend approximately 2 times the broadening (gamma) such that the critical point can be mapped in reciprocal space. The broadening for the E1 transition critical point may be located at an energy of about 0.118 eV. Therefore, a lower bound energy cut-off of 3 to 3.13 eV may be sufficient. For an upper bound energy cut-off, the data may be considered such that additional information corresponding to the semiconductor material is included. For example, in silicon, the upper bound energy cut-off occurs at approximately 4.2 eV. Also, any quantum confinement effects may shift the silicon direct band edge to higher energies as governed by Eq. 1. Therefore, the upper-bound energy cut off must be sufficient to capture the 2D confined critical point. In one embodiment, theoretical calculations based on Eq. 1 show that for a quantum confined silicon layer of approximately 2 nm, there is an increase in the ground state energy equal to approximately 0.5 eV. Therefore, the upper energy bound cut-off may be between 3.9 to 4.0 eV such that the contribution from the 2D confined critical point is captured.

Next, the raw data may be transformed into reciprocal space data (step 304). In one embodiment, Fourier coefficients may be constructed from the direct transformation of the data obtained in step 300 into reciprocal space. This transformation may not eliminate artificial effects such as endpoint discontinuities and coordinate transformations away from the inversion origin.

Upon constructing the Fourier coefficients, the endpoint discontinuity may be removed. In one embodiment, the endpoint discontinuities may be identified from a high index region of the Fourier coefficients. Within the real space data, discontinuities in both the value and slope at each endpoint may cause errors upon transformation into reciprocal space since periodicity is a constraint for these types of operations. These discontinuities can be reduced or even eliminated by subtracting the appropriate smoothly varying function from the real space data $f_j$. A set of Legendre polynomials are defined as follows:

$$f_a(j) = 1;$$

$$f_b(j) = j - j_0;$$

$$f_c(j) = (j - j_0)^2 - \Delta(\Delta + 2)/12;$$

$$f_d(j) = (j - j_0)^3 - (j - j_0)(3\Delta^2 + 6\Delta - 4)/20; \quad \text{Eq. 10}$$

where j is the $n^{th}$ (n=1, 2, 3 ... max) data point, and $\Delta = j_{max} - j_1$. In one embodiment, the discontinuity may affect the average value, the endpoint value, the endpoint slope, and the average slope. Eq. 10, particularly $f_a$, $f_b$, $f_c$, and $f_d$ corrects for the affects on average value, the endpoint value, the endpoint slope, and the average slope, respectively. Next, each polynomial may be multiplied by a scaling coefficient. The data points for which the endpoint discontinuity has been removed is:

$$\delta f_j = f_j - C_a f_a(j) - C_b f_b(j) - C_c f_c(j) - C_d f_d(j); \quad \text{Eq. 11}$$

where the Cs are the scaling coefficients. These coefficients may be determined by minimizing the mean squared deviation of the difference between the Fourier coefficients of the data and those of the scaled set of polynomials:

$$\delta^2 = \Sigma((A_n - C_a A_{n,a} - C_c A_{n,c})^2 + (B_n - C_b B_{n,b} - C_d B_{n,d})^2); \quad \text{Eq. 12}$$

where the sum is restricted to the noise region of the reciprocal space data, $A_n$ and $B_n$ are the original Fourier coefficients, and $A_{n,a}$ refers to the Fourier coefficients of the $f_a$ polynomial, etc. The corrected Fourier coefficients with endpoint discontinuities removed can then be defined as:

$$\delta A_n = A_n - C_a A_{n,a} - C_c A_{n,c};$$
$$\delta B_n = B_n - C_b B_{n,b} - C_d B_{n,d}; \quad \text{Eq. 13}$$

The Fourier coefficients may be calculated with respect to a pre-defined inversion origin, $j_0$. This origin is chosen for parity reasons and may not correspond to the true inversion origin contribution of the critical point. Therefore, it may be necessary to relate the reciprocal space results centered upon the inversion origin $j_0$ to the critical point inversion origin $j_0'$. This can be accomplished by applying the shift theorem for transform functions. To calculate the Fourier coefficients centered around the critical point inversion origin $j_0'$ with respect to the raw data inversion origin $j_0$:

$$\delta A'_n = \delta A_n \cos\left(\frac{2\pi n(j'_0 - j_0)}{M}\right) + \delta B_n \sin\left(\frac{2\pi n(j'_0 - j_0)}{M}\right);$$

$$\delta B'_n = -\delta A_n \sin\left(\frac{2\pi n(j'_0 - j_0)}{M}\right) + \delta B_n \cos\left(\frac{2\pi n(j'_0 - j_0)}{M}\right); \quad \text{Eq. 14}$$

where M is the number of data points (i.e., $n = j_{max}$).

Next the amplitude and phase of the Fourier coefficients may be calculated. In one embodiment, Eq. 6 and Eq. 7 may be used to determine the amplitude and the phase. Next, a natural logarithmic of the amplitude and the phase may be graphed versus the Fourier index, similar to the graph shown in FIG. 1B.

As noted above, interference fringes may determine if the critical points have been captured. Particularly, interference fringes may identify quantum confined silicon layers with optical properties that are different than conventional bulk silicon. In one embodiment, the natural logarithmic graph constructed may be observed, in particular in the medium range Fourier coefficients, to determine if interference fringes exist (step 306). The medium range coefficients may be used because this range may include the critical point information, whereas the low range coefficients may represent baseline effects and the high range represents noise. If interference fringes do not exist, the semiconductor material may be analyzed using conventional techniques and parameters such as thickness may be determined.

If interference fringes are observed, then more than one critical point is present and is different from that of the bulk 3D silicon critical point. Next, critical point information in the reciprocal space may be determined using the combined critical point parameters C, Γ, $E_g$, and μ using Eq. 6 and Eq. 7 (step 308). In some embodiments, using graphs similar to FIG. 1B, the slope of the natural logarithm graph of the amplitude (Ln[C]) versus the Fourier index, n, provides the broadening, Γ. The slope of the phase (vs. the Fourier index, n) gives the band gap $E_g$ and the intercept gives the order, u.

Next the reciprocal space data is converted into real space data (step 310). Using Eq.5, the combined critical point parameters determined in step 308 may be re-casted in real space (i.e., as a function of energy, E) and at least one critical point parameter point parameter is determined (step 312). For example, using the 3D critical point parameters (C, Γ, μ, $E_g$), the difference can be subtracted out to leave the remaining contribution, which in some embodiments, may be the 2D critical point parameters.

If a 2D critical point is established, the thickness of the substrate may be determined (step 314). In one embodiment, the critical point energy of the 2D and 3D may be determined, respectively. For example, using Eq. 1, where ΔE is the difference between the 2D and 3D critical point energy, the thickness of top silicon layer of a SOI substrate can be determined as follows:

$$L = \frac{\pi \hbar}{\sqrt{2m^* \Delta E}}. \quad \text{Eq. 15}$$

All of the methods disclosed and claimed can be made and executed without undue experimentation in light of the present disclosure. While the methods of this invention have been described in terms of embodiments, it will be apparent to those of skill in the art that variations may be applied to the methods and in the steps or in the sequence of steps of the method described herein without departing from the concept, spirit and scope of the invention. All such similar substitutes and modifications apparent to those skilled in the art are deemed to be within the spirit, scope, and concept of the disclosure as defined by the appended claims.

The invention claim is:

1. A method comprising:
    providing a semiconductor material comprising a plurality of layers;
    obtaining data corresponding to the semiconductor material;
    transforming the data into reciprocal space data;
    determining at least one critical point from the reciprocal space data;
    converting the at least one critical point of the reciprocal space data to real space data; and
    characterizing at least one of the plurality of layers of the semiconductor material based on the real space data.

2. The method of claim 1, the semiconductor material being selected from the group consisting of bulk silicon substrate, silicon-on-insulator (SOI) substrates, strained silicon-on-insulator (sSOI) substrates, silicon-germanium-on-insulator (GOI) substrates, and strained silicon-germanium-on-insulator (sGeOI) substrates.

3. The method of claim 1, the step of obtaining data comprising spectroscopic ellipsometry, reflectometry, modulation spectroscopy, photo-luminescence, second harmonic generation (SHG), or any combination thereof.

4. The method of claim 1, the step of obtaining data comprising:
    illuminating the substrate with a light beam from a light source; and
    detecting light reflected from the substrate.

5. The method of claim 4, furthering comprising polarizing the light beam from the light source.

6. The method of claim 1, the step of transforming the data further comprising constructing Fourier coefficients.

7. The method of claim 6, the step of transforming the data further comprising calculating an amplitude and phase of the Fourier coefficients.

8. The method of claim 7, the step of transforming the data further comprising determining a natural logarithm of the amplitude and phase versus a Fourier index.

9. The method of claim 8, the data comprising at least one critical point.

10. The method of claim 9, the step of transforming the data further comprising determining interference fringes in the natural logarithm for determining a 2D critical point.

11. The method of claim 10, further comprising determining a 3D critical point.

12. The method of claim 11, further comprising determining a critical energy point for the 2D and 3D critical points.

13. The method of claim 12, further comprising using a difference between the critical energy point for the 2D and 3D critical points to determine a thickness of a layer of the semiconductor material.

14. A program storage device readable by a machine, tangibly embodying a program of instructions executable by the machine to perform the method steps of claim 1.

15. A method comprising:
provating a silicon on insulator substrate;
obtaining data corresponding to the silicon on insulator substrate;
transforming the data into reciprocal space data;
determining at least one critical point from the reciprocal space data;
converting the at least one critical point of the reciprocal space data to real space data; and
determining a thickness of a layer of the silicon on insulator substrate.

16. A system comprising:
a light source for illuminating a semiconductor material;
a detector coupled to the semiconductor material for detecting a light reflected from the semiconductor material and generating data corresponding to the semiconductor material;
a processor coupled to the detector, the processor configured for:
receiving the generated data;
transforming the data into reciprocal space data;
determining at least one critical point from the reciprocal space data;
converting the at least one critical point of the reciprocal space data to real space data; and
characterizing the semiconductor material based on the real space data.

17. The system of claim 16, the semiconductor material being selected from the group consisting of bulk silicon substrate, silicon-on-insulator (SOI) substrates, strained silicon-on-insulator (sSOI) substrates, silicon-germanium-on-insulator (GOI) substrates, and strained silicon-germanium-on-insulator (sGeOI) substrates.

18. The system of claim 16, the light source comprising a laser, an ultraviolet light source, or a visible light source.

19. The system of claim 16, the detector generating data corresponding to spectroscopic ellipsometry, reflectometry, modulation spectroscopy, photo-luminescence, second harmonic generation (SHG), or any combination thereof.

20. The system of claim 16, the processor further configured to determine a thickness of at least one of a plurality of layers of the semiconductor material.

\* \* \* \* \*

UNITED STATES PATENT AND TRADEMARK OFFICE
CERTIFICATE OF CORRECTION

PATENT NO. : 7,580,138 B2
APPLICATION NO. : 11/179357
DATED : August 25, 2009
INVENTOR(S) : James Martin Price It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1078 days.

Signed and Sealed this

Fourteenth Day of September, 2010

David J. Kappos
*Director of the United States Patent and Trademark Office*